United States Patent
Ito et al.

(10) Patent No.: US 6,861,705 B2
(45) Date of Patent: Mar. 1, 2005

(54) DRIVER CIRCUITS AND METHODS FOR MANUFACTURING DRIVER CIRCUITS

(75) Inventors: Satoshi Ito, Nagano-ken (JP); Kazuhiko Okawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/801,025

(22) Filed: Mar. 7, 2001

(65) Prior Publication Data

US 2001/0052651 A1 Dec. 20, 2001

(30) Foreign Application Priority Data

Mar. 7, 2000 (JP) .......................................... 2000-062305
Dec. 8, 2000 (JP) .......................................... 2000-375104

(51) Int. Cl.[7] .............................................. H01L 29/78
(52) U.S. Cl. ......................... 257/341; 257/758; 257/920
(58) Field of Search ................................. 257/341, 758, 257/920

(56) References Cited

U.S. PATENT DOCUMENTS

| 4,278,989 A | * | 7/1981 | Baba et al. |
| 5,210,436 A | | 5/1993 | Kakizoe et al. |
| 5,366,916 A | | 11/1994 | Summe et al. |
| 5,789,791 A | * | 8/1998 | Bergemont |

FOREIGN PATENT DOCUMENTS

| EP | 0501723 | 9/1992 |
| JP | 61-044854 | 3/1986 |
| JP | 1-259560 | 10/1989 |
| JP | 2-271673 | 11/1990 |
| JP | 2-271674 | 11/1990 |
| JP | 4-271674 | 9/1992 |
| JP | 05-048022 | 2/1993 |
| JP | 07-022516 | 1/1995 |
| JP | 10-116986 | 5/1998 |
| JP | 11-238865 | 8/1999 |

OTHER PUBLICATIONS

Notice of Reasons for Rejection for Japanese Patent Application 2000–375104 (which cites the two references above).
U.S. Ser. No. 09/693,234, filed Oct. 20, 2000.
Japanese examination report for Japanese Patent Application 2000–375104 dated Jan. 13, 2004.
translation (and Japanese copy) of previously submitted Japanese reference No. 61–44854, published Mar. 25, 1986.

* cited by examiner

Primary Examiner—Jerome Jackson
(74) Attorney, Agent, or Firm—Konrad Raynes & Victor, LLP; Alan S. Raynes

(57) ABSTRACT

Embodiments include a driver circuit that is suitable to prevent a delay in responding to an input of a drive signal and a method for manufacturing the same. Three contact holes are provided for each of the transistors $T_{r1}$–$T_{r4}$ for connecting the gate electrodes of the transistors to the signal lines $L_s$, $L_{s1}$–$L_{s4}$ that are separated from the transistors $T_{r1}$–$T_{r4}$ by the dielectric layer 14. As a result, the time for an input signal to reach the entire area of the gate electrodes becomes shorter and a response to an input of a drive signal becomes faster.

23 Claims, 10 Drawing Sheets

DRIVER CIRCUITS AND METHODS FOR MANUFACTURING DRIVER CIRCUITS

Applicants hereby incorporate Japanese Patent Application No. 2000-062305, filed Mar. 7, 2000, in its entirety. Applicants hereby incorporate Japanese Patent Application No. 2000-375104, filed Dec. 8, 2000, in its entirety.

TECHNICAL FIELD

The present invention relates to driver circuits having a plurality of transistors and methods for manufacturing the same in which a single drive signal is applied to each of the transistors to drive the transistors to thereby drive a load, and more particularly to driver circuits and methods for manufacturing the same that can effectively prevent a delay in a response to the input of the drive signal.

RELATED ART

One example of a conventional high-output driver circuit that drives a load is shown in FIG. 10. FIG. 10 shows a plan view of the conventional driver circuit as viewed in a direction in which layers are stacked.

The driver circuit is formed from a semiconductor integrated circuit with a multiple wiring layered structure. For example, as shown in FIG. 10, the driver circuit has four transistors $T_{r1}$–$T_{r4}$. A single drive signal is applied to each of the transistors $T_{r1}$–$T_{r4}$ to drive the transistors $T_{r1}$–$T_{r4}$ to thereby drive a load. More particularly, the semiconductor integrated circuit forming the driver circuit is formed from a semiconductor substrate, a dielectric layer formed over the semiconductor substrate and a wiring layer formed over the dielectric layer (not shown).

Gate electrodes $G_1$–$G_4$ are formed on the semiconductor substrate. The gate electrodes $G_1$–$G_4$ are formed from polysilicon or polycide including polysilicon are formed for the respective transistors $T_{r1}$–$T_{r4}$. A signal line $L_s$ composed of an aluminum alloy is formed in the wiring layer for supplying the drive signal. The signal line $L_s$ is formed with a segment that perpendicularly traverses the gate electrodes $G_1$–$G_4$ such that the signal line $L_s$ passes end sections of the gate electrodes $G_1$–$G_4$. Contact holes $H_1$–$H_4$ for connecting the gate electrodes $G_1$–$G_4$ to the signal line $L_s$ are formed at intersections of the gate electrodes $G_1$–$G_4$ to the signal line $L_s$.

PROBLEMS WITH THE RELATED ART

In the conventional driver circuit described above, each of the gate electrodes $G_1$–$G_4$ has a relatively large gate width and is formed from polysilicon that has a relatively high sheet resistance. Also, the drive signal is inputted to each of the gate electrodes $G_1$–$G_4$ through a single contact hole. As a result, problems occurs in that it takes time for the input signal to reach the entire area of the gate electrodes, and therefore a delay occurs in responding to the input of the drive signal.

SUMMARY

Embodiments include a driver circuit including a semiconductor integrated circuit having a transistor in which a drive signal is applied to the transistor to drive the transistor to thereby drive a load. The driver circuit comprises a signal line that supplies the drive signal, the signal line being separated from the transistor by a dielectric layer. The driver circuit also includes at least two connection sections that connect the signal line to a gate electrode of the transistor, the connection sections being provided in a width direction of the gate electrode.

Embodiments also include to a driver circuit comprising a semiconductor integrated circuit having a plurality of transistors in which a single drive signal is applied to each of the transistors to drive the transistors to thereby drive a load. The driver circuit comprises a signal line that supplies the drive signal, the signal line being separated from each of the transistors by a dielectric layer. The driver circuit also includes at least two connection sections that connect the signal line to a gate electrode of at least one of the transistors, the connection sections being provided in a width direction of the gate electrode.

Embodiments also include a driver circuit comprising a semiconductor integrated circuit having a plurality of transistors in which a single drive signal is applied to each of the transistors to drive the transistors to thereby drive a load, wherein the driver circuit includes a signal line that supplies the drive signal, the signal line being separated from each of the transistors by a dielectric layer; and connection sections for connecting the signal line to a gate electrode of each of the transistors, the connection sections being provided in a width direction of the gate electrode, wherein at least two of the plurality of transistors have a different number of connection sections.

Embodiments also include a method for manufacturing a driver circuit including a semiconductor integrated circuit having a plurality of transistors in which a single drive signal is applied to each of the transistors to drive the transistors to thereby drive a load. The method includes forming a gate electrode for each of the transistors on a substrate that includes a semiconductor region. The method also includes forming a dielectric layer over the transistors. The method also includes forming contact holes in the dielectric layer for connecting signal lines that supply the drive signal to the gate electrodes, the signal lines being located in a layer above the dielectric layer. The method also includes forming the signal lines over the dielectric layer. In addition, two or more of the contact holes are formed for at least one of the plurality of transistors in the contact hole forming step.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
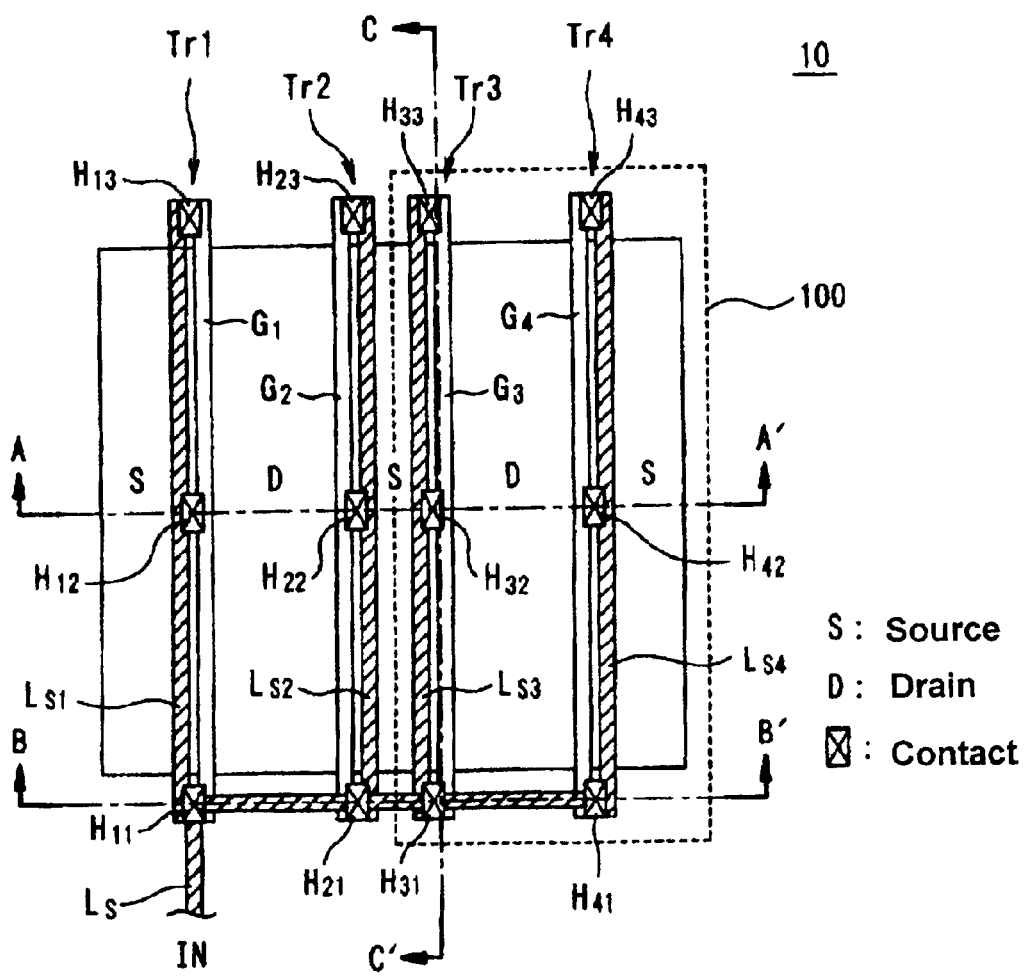
FIG. 1 is a plan view of a driver circuit 10 as viewed in a direction in which the layers are stacked in accordance with an embodiment of the present invention.

Certain embodiments of the present invention relate to driver circuits and methods for manufacturing the same that effectively inhibit or prevent a delay in a response to an input of a drive signal.

One aspect of certain embodiments relates to a driver circuit which comprises a semiconductor integrated circuit having a transistor in which a drive signal is applied to the transistor to drive the transistor to thereby drive a load, the driver circuit comprising: a signal line that supplies the drive signal, the signal line being separated from the transistor by a dielectric layer; and at least two connection sections that connects the signal line to a gate electrode of the transistor, the connection sections being provided in a width direction of the gate electrode.

With the structure described above, the drive signal from the signal line is inputted in the gate electrode through at least the two connection sections that are provided in the width direction of the gate electrode. As a result, the time for the input signal to reach the entire area of the gate electrode is shortened, and a response to an input of the drive signal becomes relatively faster, compared to the conventional structure.

Furthermore, a driver circuit in accordance with a second aspect of certain embodiments of the present invention comprises a semiconductor integrated circuit having a plurality of transistors in which a single drive signal is applied to each of the transistors to drive the transistors to thereby drive a load, the driver circuit comprising: a signal line that supplies the drive signal, the signal line being separated from each of the transistors by a dielectric layer; and at least two connection sections that connect the signal line to a gate electrode of at least one of the transistors, the connection sections being provided in a width direction of the gate electrode.

With the structure described above, the drive signal from the signal line is inputted in at least one of the gate electrodes through at least the two connection sections that are provided in the width direction of the gate electrode. As a result, the time for the input signal to reach the entire area of the gate electrodes is shortened, and a response to an input of the drive signal becomes relatively faster, compared to the conventional structure.

Furthermore, in a driver circuit in accordance with a third aspect of certain embodiments of the present invention, each of the transistors in the driver circuit of the second aspect described above is provided with two or more connection sections.

With the structure described above, the drive signal from the signal line is inputted in each of the gate electrodes through at least the two connection sections that are provided in the width direction of the gate electrode. As a result, the time for the input signal to reach the entire area of the gate electrodes is shortened, and a response to an input of the drive signal becomes relatively faster, compared to the conventional structure.

Furthermore, in a driver circuit set forth in accordance with a fourth aspect of certain embodiments of the present invention, two or more connection sections are provided for each of the transistors except one of the transistors in the driver circuit of the second aspect described above.

With the structure described above, the drive signal from the signal line is inputted in all of the gate electrodes except one of the gate electrodes through at least the two connection sections that are provided in the width direction of each of the gate electrodes. As a result, the time for the input signal to reach the entire area of the gate electrodes is shortened, and a response to an input of the drive signal becomes relatively faster, compared to the conventional structure.

Furthermore, in a driver circuit set forth in accordance with a fifth aspect of certain embodiments of the present invention, at least two of the plurality of transistors of the driver circuit of any one of the second, third or fourth aspects described above have different numbers of connection sections.

With the structure described above, the drive signal from the signal line is inputted in at least two of the transistors through the connection sections that are provided in different numbers. As a result, the input signal reaches the entire area of each of the respective gate electrodes in different times. Accordingly, switching for the transistors start at different timings.

It is noted that at least two of the plurality of transistors may be provided with the connection sections in different numbers. For example, when five transistors are provided, one of the five transistors may have two connection sections, and each of the remaining four transistors may have three connection sections. Alternatively, each of the five transistors may have different numbers of connection sections.

Furthermore, a driver circuit set forth in accordance with a sixth aspect of certain embodiments of the present invention comprises a semiconductor integrated circuit having a plurality of transistors in which a single drive signal is applied to each of the transistors to drive the transistors to thereby drive a load, the driver circuit comprising: a signal line that supplies the drive signal, the signal line being separated from each of the transistors by a dielectric layer; and connection sections for connecting the signal line to a gate electrode of each of the transistors, the connection sections being provided in a width direction of the gate electrode, wherein at least two of the plurality of transistors have a different number of connection sections.

With the structure described above, the drive signal from the signal line is input in at least two of the transistors through the connection sections that are provided in different numbers. As a result, the input signal reaches the entire area of each of the respective gate electrodes in different times. Accordingly, switching for the transistors start at different timings.

Furthermore, in a driver circuit set forth in accordance with a seventh aspect of certain embodiments of the present invention, each of the transistors of the driver circuit in aspects 5 or 6 described above is provided with the connection sections in different numbers.

With the structure described above, the drive signal from the signal line is inputted in each of the transistors through the connection sections that are provided in different numbers. As a result, the input signal reaches the entire area of each of the respective gate electrodes in different times. Accordingly, switching for the transistors start at different timings.

Moreover, a method is provided in accordance with an eight aspect of certain embodiments of the present invention for manufacturing a driver circuit including a semiconductor integrated circuit having a plurality of transistors in which a single drive signal is applied to each of the transistors to drive the transistors to thereby drive a load. The method comprising: a gate electrode forming step for forming a gate electrode for each of the transistors on a substrate that includes a semiconductor region; a dielectric layer forming step for forming a dielectric layer over the transistors; a contact hole forming step for forming contact holes in the dielectric layer for connecting signal lines that supply the drive signal to the gate electrodes, the signal lines being located in a layer above the dielectric layer; and a wiring layer forming step for forming the signal lines over the dielectric layer, wherein two or more of the contact holes are formed for at least one of the plurality of transistors in the contact hole forming step.

It is noted that the contact hole forming step may be conducted in any manner so long as at least one of the plurality of transistors has two or more contact holes. For example, in accordance with one embodiment, two or more contact holes may be formed for each of the transistors.

Also, in the contact hole forming step in accordance with a ninth aspect of certain embodiments of the present invention, two or more contact holes may be formed for each of the transistors except one of the transistors.

Also, in the contact hole forming step in accordance with still another aspect of certain embodiments of the present invention, at least two of the transistors are provided with contact holes in different numbers.

As a result, switching for at least two of the plurality of transistors start at different timings. Accordingly, compared to the method for manufacturing a driver circuit set forth in the eigth aspect described above, additional effects are obtained. For example, the voltage on a power supply line that supplies a current to the transistors does not greatly shift, the current noise is reduced, and noises are difficult to be generated on the output.

In particular, in case of a high output transistor that has a relatively large gate width, greater effects are obtained in increasing the switching speed and differentiating the switching timings. Accordingly, the application of certain embodiments of the present invention is more preferable in the case of a high output transistor.

Also, in the contact hole forming step in accordance with still another aspect of certain embodiments of the present invention, all of the transistors may be provided with contact holes in different numbers.

A first embodiment of the present invention is described below with reference to the accompanying drawings. FIGS. 1 through 5 show a driver circuit and a method for manufacturing a driver circuit in accordance with the first embodiment of the present invention.

In the driver circuit that is formed from a semiconductor integrated circuit with a multiple wiring layered structure and the method for manufacturing the same in accordance with the embodiment, the present invention is applied to inhibit or prevent a delay in a response to an input of a drive signal in the driver circuit. As shown in FIG. 1, the driver circuit has transistors $T_{r1}-T_{r4}$. A single drive signal is applied to each of the transistors $T_{r1}-T_{r4}$ to drive the transistors $T_{r1}-T_{r4}$ to thereby drive a load.

Figure 2:
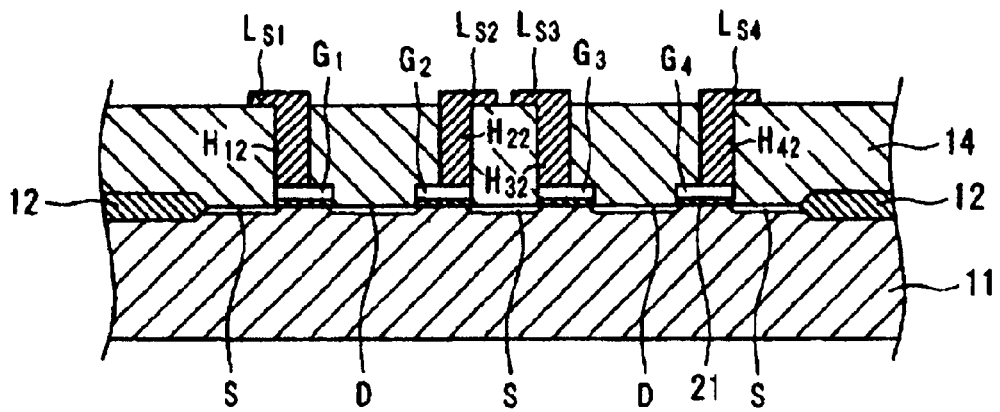
FIGS. 2(a)–2(c) are cross-sectional views taken along a line A–A', B–B' and C–C' or FIG. 1, respectively.
Figure 2:
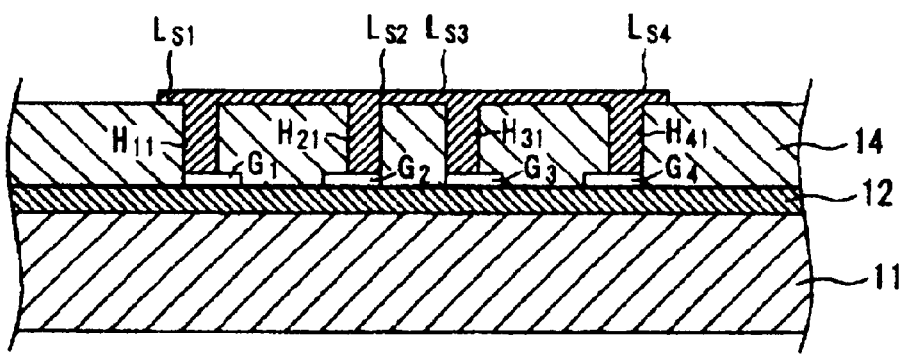
Figure 2:
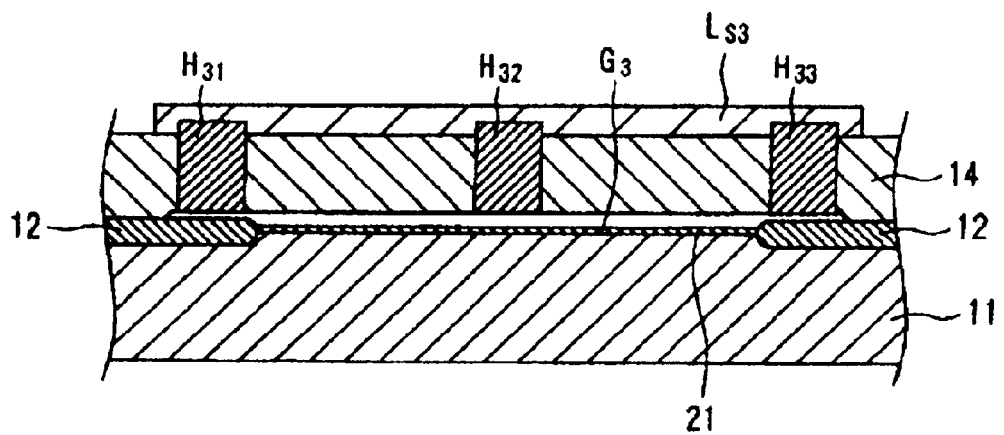

First, a driver circuit 10 in accordance with the present embodiment is described with reference to FIGS. 1 and 2. FIG. 1 is a plan view of the driver circuit 10 as viewed in a direction in which the layers are stacked. FIGS. 2(a)–2(c) are cross-sectional views taken along a line A–A', line B–B' and line C–C' of FIG. 1, respectively.

As shown in FIGS. 1 and 2(a)–2(c), the driver circuit 10 is formed from a semiconductor integrated circuit with a multiple wiring layered structure. For example, the driver circuit 10 has four transistors $T_{r1}-T_{r4}$. A single drive signal is applied to each of the transistors $T_{r1}-T_{r4}$ to drive the transistors $T_{r1}-T_{r4}$ to thereby drive a load. More particularly, as shown in FIGS. 2(a)–2(c), the semiconductor integrated circuit forming the driver circuit 10 is formed from a semiconductor substrate 11, a dielectric layer 14 formed over the semiconductor substrate 11 and a wiring layer formed over the dielectric layer 14.

Gate electrodes $G_1-G_4$ are formed over the semiconductor substrate 11 as gate electrodes of the respective transistors $T_{r1}-T_{r4}$. The gate electrodes $G_1-G_4$ are preferably formed from polysilicon. The polysilicon has a sheet resistance of, for example, 100 $\Omega/\square$, and each gate width is, for example, about 80 $\mu$m.

A signal line $L_s$ composed of an aluminum alloy is formed in the wiring layer for supplying the drive signal. The signal line $L_s$ is preferably formed with a segment that perpendicularly traverses the gate electrodes $G_1-G_4$ such that the signal line $L_s$ passes end sections of the gate electrodes $G_1-G_4$. Also, signal lines $L_{s1}-L_{s4}$ are preferably formed in a manner to extend over and in parallel with the respective gate electrodes $G_1-G_4$. One end of the signal lines $L_{s1}-L_{s4}$ connect to the signal line $L_s$. The aluminum alloy has a sheet resistance of, for example, 50 m$\Omega/\square$.

Three contact holes ($H_{11}-H_{13}$, $H_{21}-H_{23}$, $H_{31}-H_{33}$ and $H_{41}-H_{43}$) are provided over each of the gate electrodes $G_1-G_4$. In other words, the contact holes $H_{11}$, $H_{21}$, $H_{31}$, $H_{41}$ that connect the gate electrode $G_1-G_4$ to the signal line $L_s$ are formed at intersections of the gate electrode $G_1-G_4$ and the signal line $L_s$ as viewed in plan. The two other contact holes $H_{12}$ and $H_{13}$, $H_{22}$ and $H_{23}$, $H_{32}$ and $H_{33}$ and $H_{42}$ and $H_{43}$ are provided over each of the signal lines $L_{s1}-L_{s4}$.

Figure 3:
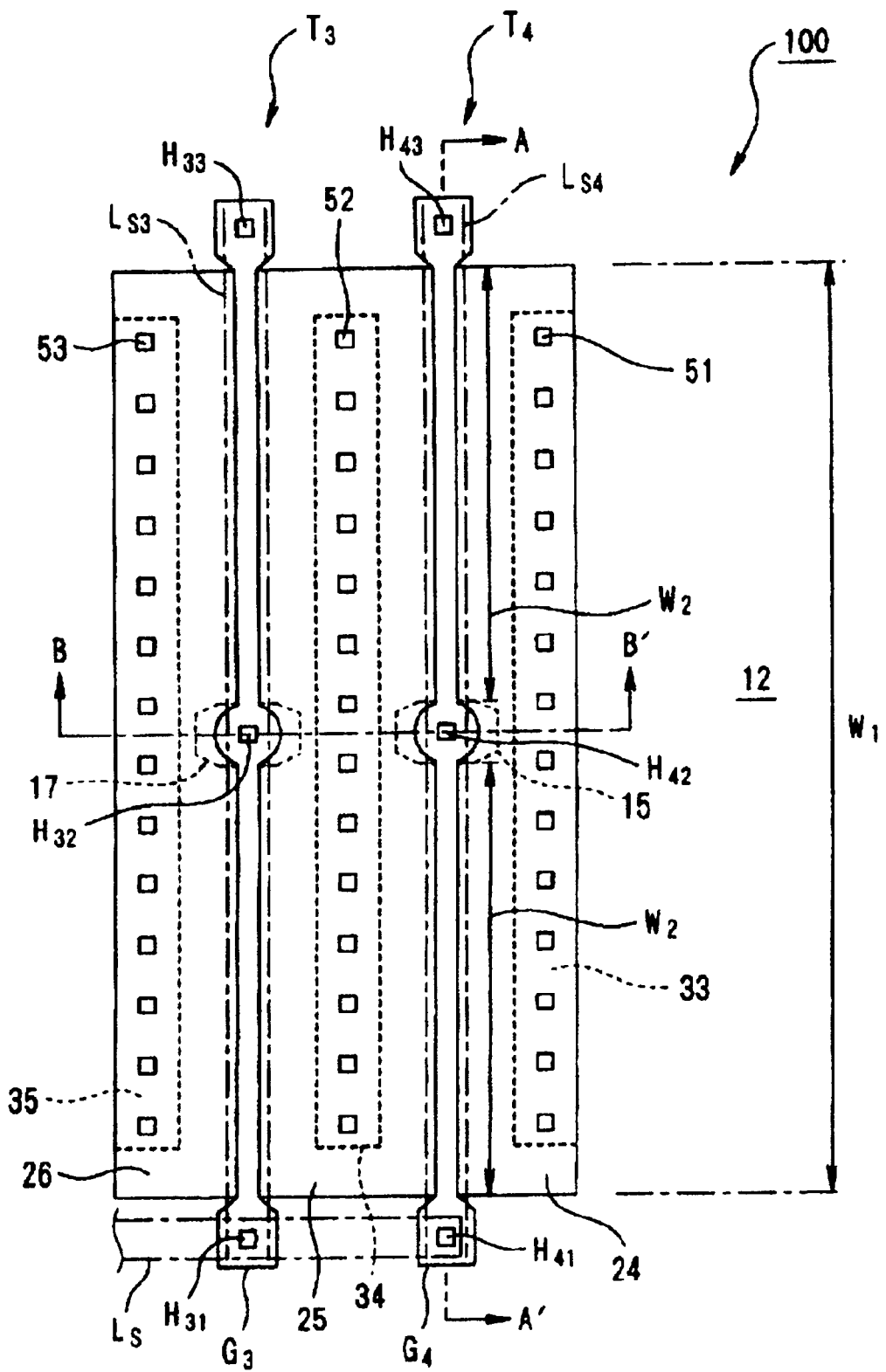
FIG. 3 is an enlarged view of an area indicated by a broken line of FIG. 1.
Figure 4:
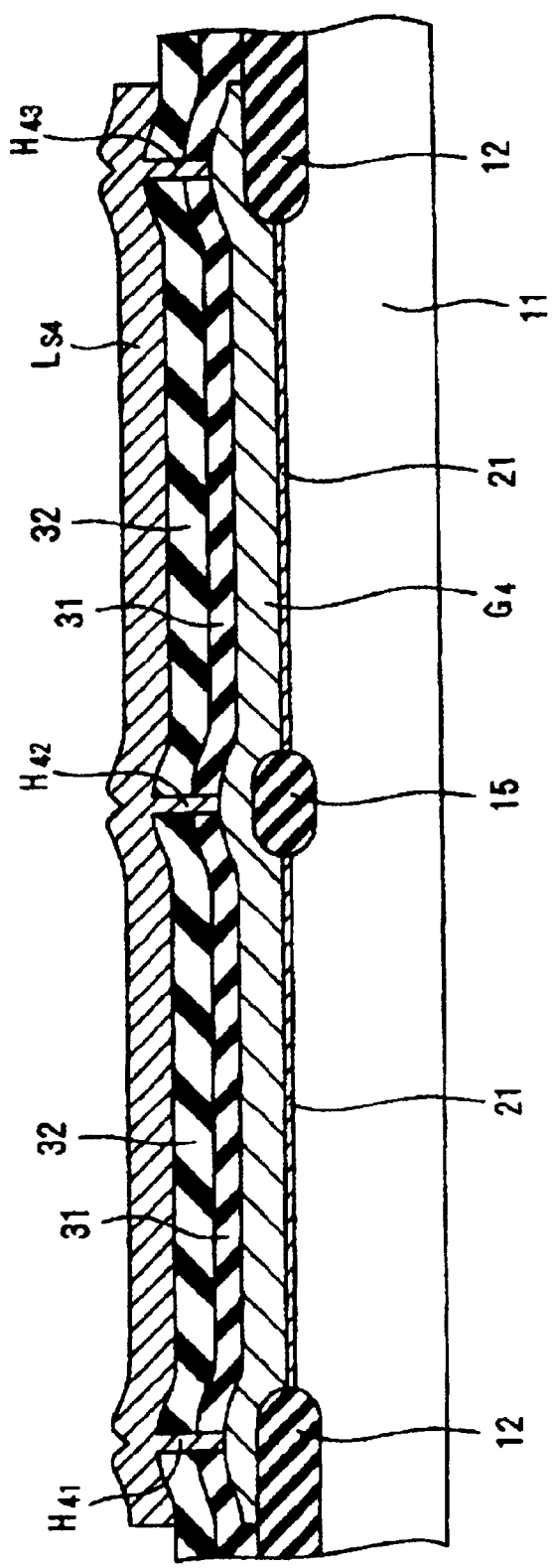
FIG. 4 is a cross-sectional view taken along a line A–A' of FIG. 3.
Figure 5:
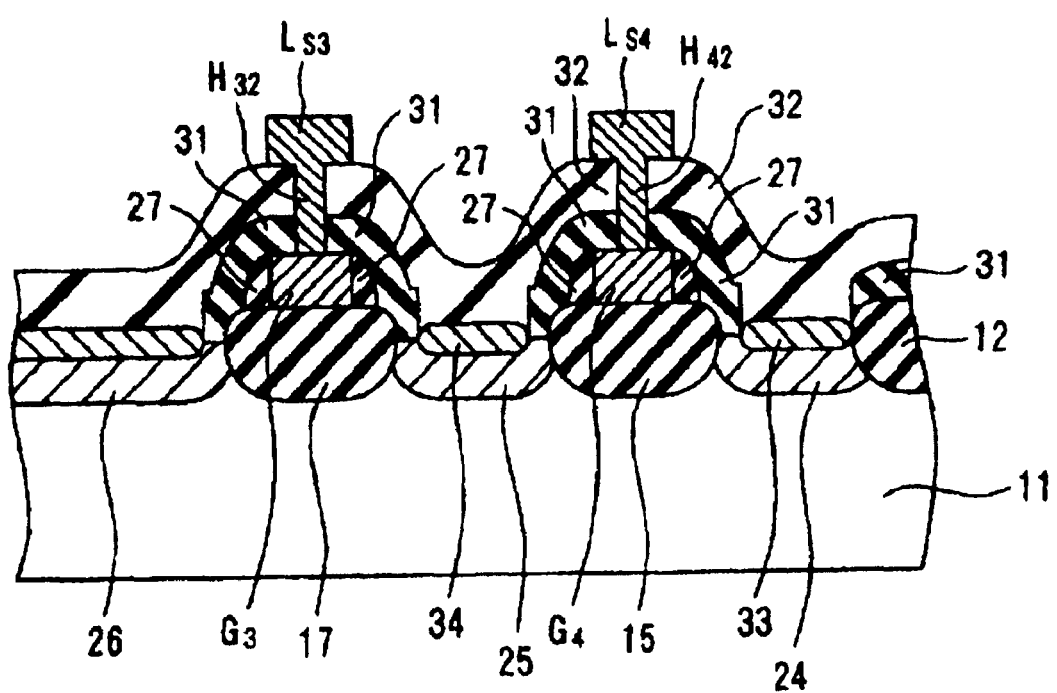
FIG. 5 is a cross-sectional view taken along a line B–B' of FIG. 3.

Next, the structure of the driver circuit 10 is described with reference to FIGS. 3 through 5. FIG. 3 is an enlarged view of a region 100 defined by a broken line in FIG. 1. FIG. 4 is a cross-sectional view taken along a line A–A' in FIG. 3. FIG. 5 is a cross-sectional view taken along a line B–B' in FIG. 3.

Referring to FIGS. 3 through 5, the gate electrode $G_3$ is disposed over a gate dielectric layer 21 and a pad-like dielectric layer 17 formed over the semiconductor substrate 11. The contact hole $H_{32}$ is formed over the gate electrode $G_3$ in a region where the pad-like dielectric layer 17 is formed. Furthermore, each end section of the gate electrode $G_3$ is disposed over a dielectric layer 12 that forms an element isolation region 12, and contact holes $H_{31}$ and $H_{33}$ are formed in the respective end sections of the gate electrode $G_3$.

Similarly, the gate electrode $G_4$ is disposed over the gate dielectric layer 21 and a pad-like dielectric layer 15 formed over the semiconductor substrate 11. The contact hole $H_{42}$ is formed over the gate electrode $G_4$ in a region where the pad-like dielectric layer 15 is formed. Furthermore, end sections of the gate electrode $G_4$ are disposed over the dielectric layer 12 that forms the element isolation region 12, and contact holes $H_{41}$ and $H_{43}$ are formed in the respective end sections of the gate electrode $G_4$.

Impurity layers that form a source region or a drain region (herebelow referred to as "impurity layers for source/drain regions") 24, 25 and 26 are formed in the semiconductor substrate 11 on both sides of each of the gate electrodes $G_3$ and $G_4$. Silicide layers 33, 34 and 35, such as, for example, titanium silicide layers, are preferably formed in part over the impurity layers for source/drain regions 24, 25 and 26. The silicide layers 33, 34 and 35 electrically connect to a wiring layer through contact holes 51, 52 and 53. The wiring layer is provided to supply a current to the impurity layers for source/drain region 24, 25 and 26.

The silicide layers 33, 34 and 35 are formed on parts of the impurity layers for source/drain region 24, 25 and 26. More specifically, the silicide layers 33, 34 and 35 are formed over the impurity layers 24, 25 and 26 at locations removed from the gate electrodes $G_3$ and $G_4$. As a result, a protection dielectric layer 31, such as, for example, a silicon oxide layer or a silicon nitride layer, is formed as a salicide protection over the impurity layers 24, 25 and 26 in areas other than the regions where the silicide layers 33, 34 and 35 are formed and over the gate electrodes $G_3$ and $G_4$.

Also, the pad-like dielectric layer 17 is formed below the gate electrode $G_3$. Similarly, the pad-like dielectric layer 15 is formed below the gate electrode $G_4$.

Portions of the gate electrode $G_3$ located above the pad-like dielectric layer 17 are preferably wider, in other words, larger in size as viewed from above, than portions of the gate electrode $G_3$ in regions where the pad-like dielectric layer 17 is not formed. Similarly, portions of the gate electrode $G_4$ located above the pad-like dielectric layer 15 are preferably wider, in other words, larger in size as viewed from above, than portions of the second gate electrode $G_4$ in regions where the pad-like dielectric layer 15 is not formed. By enlarging portions of the gate electrodes $G_3$ and $G_4$ in a manner described above, areas for forming the contact holes $H_{32}$ and $H_{42}$ over the gate electrodes $G_3$ and $G_4$ become larger, and the contact holes can be more readily formed.

The pad-like dielectric layers 15 and 17 are formed below the respective gate electrodes $G_4$ and $G_3$ in the areas where the contact holes $H_{42}$ and $H_{32}$ are formed. Because the pad-like dielectric layers 15 and 17 are present between the semiconductor substrate 11 and the contact holes $H_{42}$ and $H_{32}$, the gate dielectric layer 21 can avoid the influence of stresses that are generated during the formation of the contact holes $H_{42}$ and $H_{32}$, and thus the transistor characteristic is not deteriorated. Each of the pad-like dielectric layers 15 and 17 may preferably have a greater width as viewed from above than a width of each of the gate electrodes $G_4$ and $G_3$ to sufficiently achieve its function described above.

The contact holes $H_{31}$–$H_{33}$ at the gate electrode $G_3$ and the contact holes $H_{41}$–$H_{43}$ at the gate electrode $G_4$ are preferably formed at equal intervals, respectively. Because the plural contact holes $H_{31}$–$H_{33}$ and $H_{41}$–$H_{43}$ are preferably provided at equal intervals, a specified potential can be applied more evenly to the gate electrodes $G_3$ and $G_4$.

The pad-like dielectric layers 17 and 15 are also preferably formed at equal intervals in order to dispose the contact holes $H_{31}$–$H_{33}$ and $H_{41}$–$H_{43}$ in the manner described above. More specifically, the pad-like dielectric layer 17 is spaced a distance W2 from one end of the gate electrode $G_3$. The pad-like dielectric layer 17 is spaced a distance W2 from the other end of the gate electrode $G_3$. The pad-like dielectric layer 17 is formed adjacent to the impurity layers for source/drain regions 25 and 26, and disposed between the silicide layers 34 and 35.

Similarly, the pad-like dielectric layer 15 is spaced a distance W2 from one end of the gate electrode $G_4$. The pad-like dielectric layer 15 is spaced a distance W2 from the other end of the gate electrode $G_4$. The pad-like dielectric layer 15 is formed adjacent to the impurity layers for source/drain regions 24 and 25, and disposed between the silicide layers 33 and 34.

The gate electrode $G_3$ electrically connects to the signal line $L_{s3}$ through the contact holes $H_{31}$–$H_{33}$. Similarly, the gate electrode $G_4$ electrically connects to the signal line $L_{s4}$ through the contact holes $H_{41}$–$H_{43}$. The signal lines $L_{s3}$ and $L_{s4}$ are provided to supply current to the gate electrodes $G_3$ and $G_4$, and connected to the gate electrodes $G_3$ and $G_4$ through the plural contact holes $H_{31}$–$H_{33}$ and $H_{41}$–$H_{43}$ in order to shorten the current supply routes to the gate electrodes.

The transistors $T_3$ and $T_4$ in accordance with the present embodiment have, for example, an overall width W1 that is about 100 $\mu$m, and a segment width W2 divided by islands of the pad-like dielectric layers 17 and 15, which is, for example, about 40 $\mu$m.

Next, a method for manufacturing the driver circuit 10 is described.

The driver circuit 10 is manufactured in the following manner. First, as shown in FIGS. 4 and 5, an element isolation region 12 and pad-like dielectric layers 15 and 17 may be formed on a surface of a semiconductor substrate 11 by, for example, a LOCOS method or a trench isolation method. Then, a gate dielectric layer 21 is formed over the semiconductor substrate 11 by a thermal oxidation method. Next, gate electrodes $G_3$ and $G_4$, preferably composed of doped polysilicon, are formed over the gate dielectric layer 21. The processes described above correspond to a gate electrode forming step of certain embodiments of the present invention.

By conducting an ion implantation using the gate electrodes $G_3$ and $G_4$ as masks, an extension layer (not shown) such as an impurity diffusion layer with a low impurity concentration having an LDD structure is formed over the semiconductor substrate 11. The extension layer is formed depending on the requirements that may be determined by the device structure. Then, sidewall spacers 27 are provided on both sides of each of the gate electrodes $G_3$ and $G_4$ by a known method. Further, an ion implantation is conducted using the gate electrodes $G_3$ and $G_4$ and the sidewall spacers 27 as masks and then an annealing is conducted to form impurity layers for source/drain regions 24, 25 and 26 in the semiconductor substrate 11.

Next, a dielectric layer as a protection insulation layer is deposited over the entire surface including the gate electrodes $G_3$ and $G_4$ and the impurity layers for source/drain regions 24, 25 and 26 by a CVD method. A silicon oxide layer, a silicon nitride layer or the like can be used as the protection insulation layer. Then, opening sections are formed in the insulation layer at specified regions by an ordinary photolithography process and an etching process by a reactive ion etching, with the result that a protection insulation layer 31 (that corresponds to the dielectric layer 14) is formed. The opening sections are formed in regions where silicide layers 33, 34 and 35 (to be described below) are to be formed. Then, a metal layer (not shown) for a silicide layer, such as, for example, a titanium layer, is deposited over the entire surface including the impurity layers for source/drain regions 24, 25 and 26 that are exposed through the opening sections. Then, a heat treatment is conducted to form silicide layers 33, 34 and 35 on exposed surfaces of the impurity layers 24, 25 and 26. Then, an interlayer dielectric layer 32 (that corresponds to the dielectric layer 14) is deposited over the entire surface including the silicide layers 33, 34 and 35.

The process for forming the protection insulation layer 31 and the interlayer dielectric layer 32 described above correspond to a dielectric layer forming step of certain embodiments of the present invention.

Then, an ordinary photolithography process and an etching process with a reactive ion etching may be conducted to form contact holes $H_{31}$–$H_{33}$ in the interlayer dielectric layer 32 and the protection insulation layer 31 over the gate electrode $G_3$, and also contact holes $H_{41}$–$H_{43}$ in the interlayer dielectric layer 32 and the protection insulation layer 31 over the gate electrode $G_4$.

The process described above corresponds to a contact hole forming step of certain embodiments of the present invention.

Next, a conducting layer composed of, for example, an aluminum alloy, is deposited on inside surfaces of the contact holes $H_{31}$–$H_{33}$ and $H_{41}$–$H_{43}$ and on the interlayer dielectric layer 32.

By the processes described above, the gate electrodes $G_3$ and $G_4$ are electrically connected to the signal lines $L_{s3}$ and $L_{s4}$ through the contact holes $H_{31}$–$H_{33}$ and $H_{41}$–$H_{43}$. A resist is coated over the top, and the resist is patterned using a mask having a specified wiring pattern. Then, the aluminum thin film is etched to form wiring layers. These processes correspond to a wiring layer forming step of certain embodiments of the present invention.

It is noted that the side where the gate electrodes $G_1$ and $G_2$ are present can be simultaneously formed with the gate electrodes $G_3$ and $G_4$ using processes similar to those described above.

Next, an operation of the first embodiment is described.

When a drive signal is applied to the driver circuit 10 by a driver control circuit, the drive signal is inputted from the signal lines $L_s$, $L_{s1}$–$L_{s4}$ through the three contact holes to the respective gate electrodes $G_1$–$G_4$.

As a result, the time for the drive signal to reach the entire area of each of the gate electrodes $G_1$–$G_4$ becomes shorter and a response to an input of the drive signal becomes relatively faster, compared to the case where only one contact hole is formed for each of the gate electrodes $G_1$–$G_4$.

Figure 6:
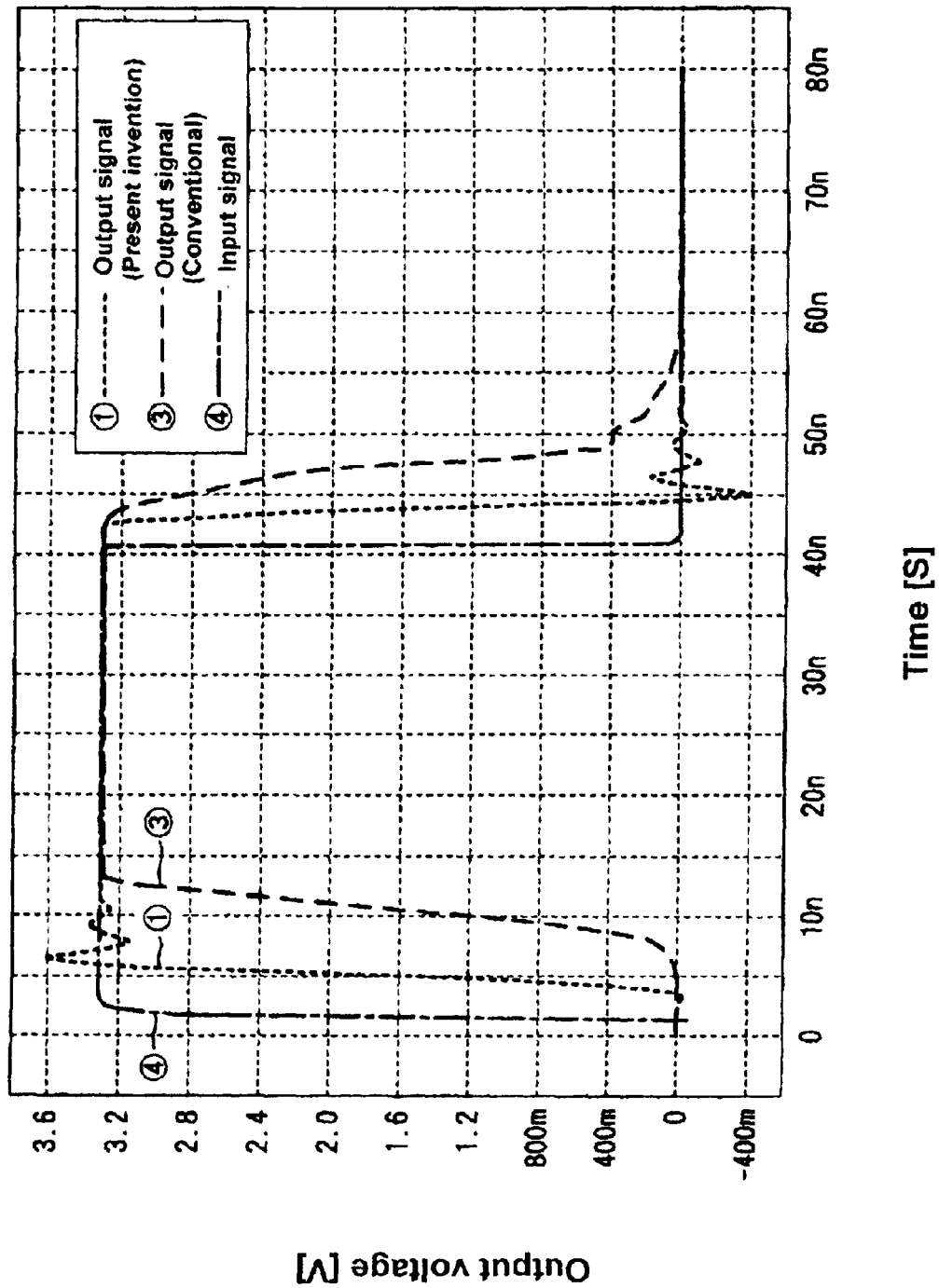
FIG. 6 is a time chart indicating a drive signal and output signals for an embodiment of the present invention.

Next, an embodiment of the present invention is described with reference to FIG. 6. FIG. 6 shows a time chart of a drive signal and output signals. In FIG. 6, a dotted line (number 1 in FIG. 6 legend) indicates an output signal that is provided from the driver circuit 10 in accordance with the embodiment of the present invention, a dashed line (number 3 in FIG. 6 legend) indicates an output signal that is provided from a conventional driver circuit, and a dash-and-dotted line (number 4 in FIG. 6 legend) indicates a drive signal that is supplied (input) to both of the driver circuits.

When a drive signal having a high level for a time duration of about 40 ns (indicated by the dash-and-dotted line in FIG. 6) is applied to the conventional driver circuit, the driver circuit provides an output signal that rises with a delay being about 10 ns later than a rise of the drive signal and falls with a delay being about 19 ns later than a fall of the drive signal, as indicated by the dashed line in FIG. 6.

On the other hand, when the same drive signal (indicated by the dash-and-dotted line in FIG. 6) is applied to the driver circuit in accordance with this embodiment of the present invention, the driver circuit provides an output signal that rises with a delay being about 3 ns later than a rise of the drive signal and falls with a delay being about 3 ns later than a fall of the drive signal, as indicated by the dotted line in FIG. 6, although the output signal has relatively large over-shoot and under-shoot.

Accordingly, it is understood that the driver circuit 10 in accordance with this embodiment of the present invention quickly responds to an input of the drive signal compared to the conventional driver circuit.

In the manner described above, in accordance with the present embodiment, three contact holes are provided for each of the transistors $T_{r1}$–$T_{r4}$ for connecting the gate electrodes of the transistors to the signal lines $L_s$, $L_{s1}$–$L_{s4}$ that are separated from the transistors $T_{r1}$–$T_{r4}$ by the dielectric layer 14.

As a result, the time for an input signal to reach the entire area of the gate electrodes becomes shorter and a response to an input of a drive signal becomes relatively faster compared to the conventional driver circuit. In particular, certain embodiments of the present invention may favorably be applied to high power output transistors having a relatively large gate width, such as the transistors $T_{r1}$–$T_{r4}$, because such high power output transistors can benefit more from the effect in increasing the switching speed provided by certain embodiments of the present invention.

As used herein, the term connection sections refers to electrical connection between the signal lines and the gate electrodes. For example, in the first embodiment of the present invention described above, the connection sections refer to the contact holes $H_{11}$–$H_{13}$, $H_{21}$–$H_{23}$, $H_{31}$–$H_{33}$ and $H_{41}$–$H_{43}$ including conducting material therein to connect the signal lines $L_s$, $L_{s1}$–$L_{s4}$ to the gate electrodes $G_1$–$G_4$.

Figure 7:
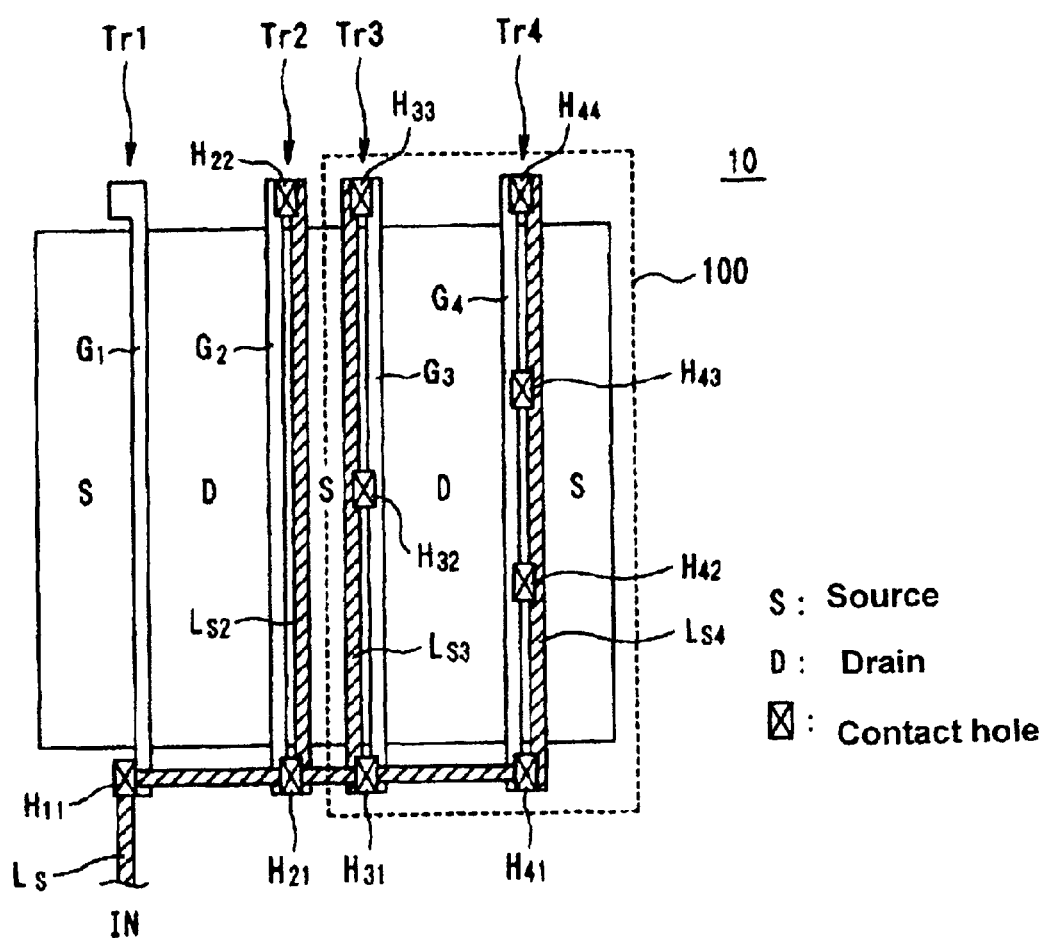
FIG. 7 is a plan view of a driver circuit 10 as viewed in a direction in which the layers are stacked in accordance with an embodiment of the present invention.
Figure 8:
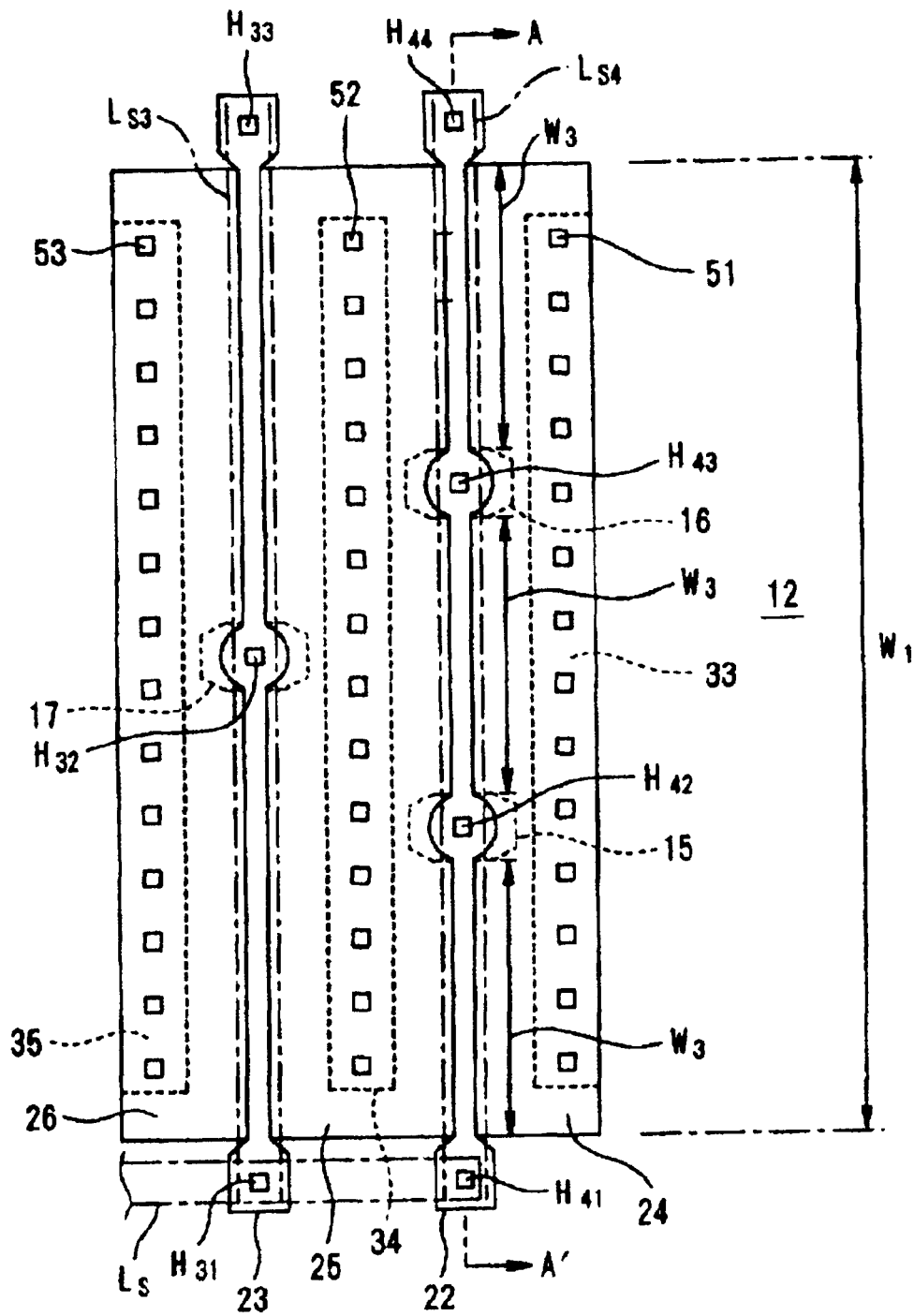
FIG. 8 is an enlarged view of an area indicated by a broken line of FIG. 7.
Figure 9:
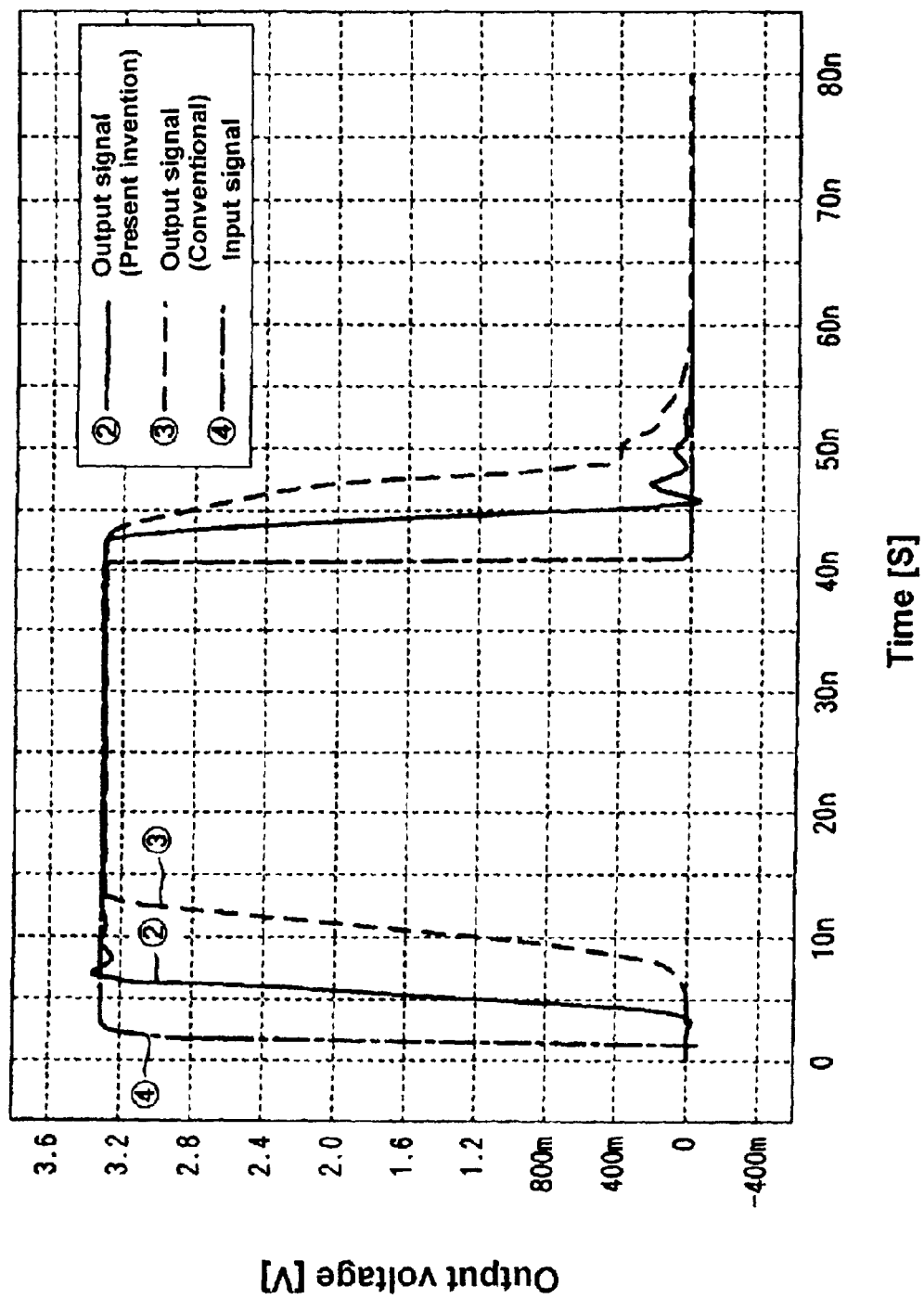
FIG. 9 is a time chart indicating a drive signal and output signals for an embodiment of the present invention.
Figure 10:
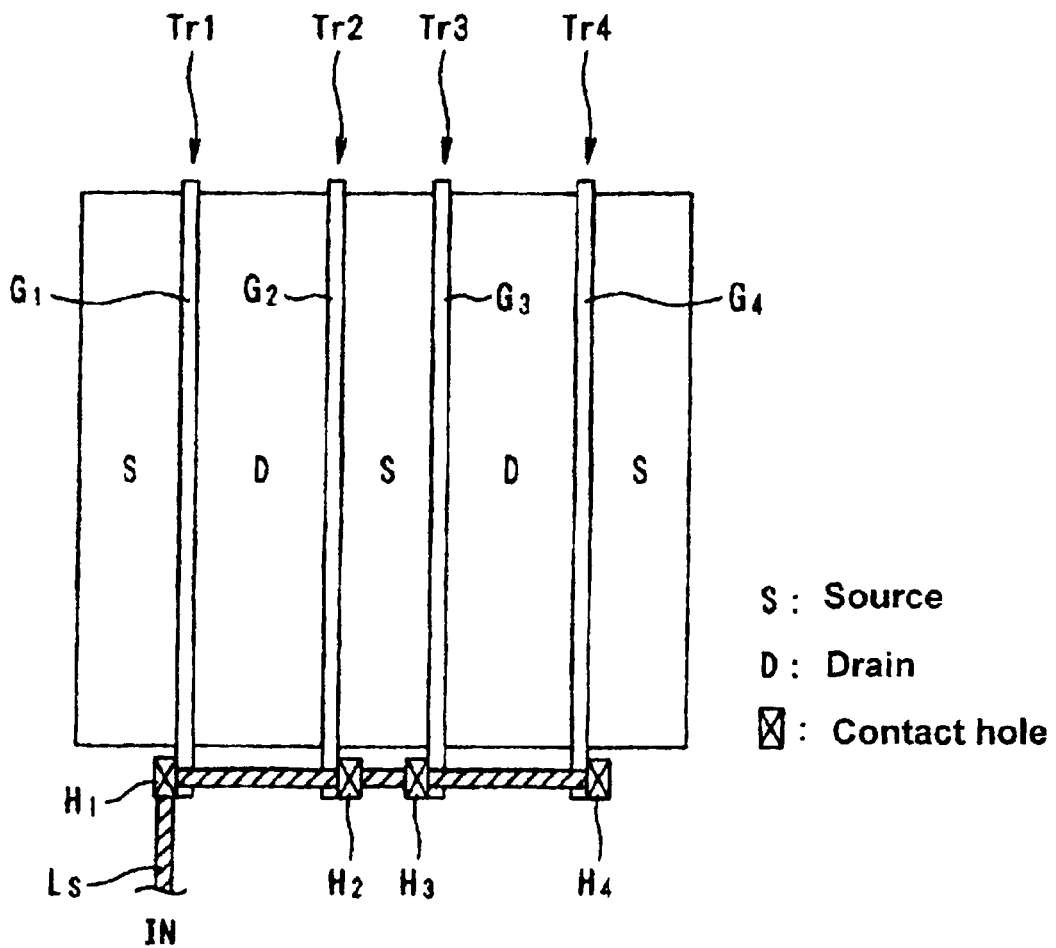
FIG. 10 is a plan view of a conventional driver circuit as viewed in a direction in which the layers are stacked.

Next, a second embodiment of the present invention is described with reference to the accompanying drawings. FIGS. 7 through 9 relate to a driver circuit and a method for manufacturing the same in accordance with the second embodiment of the present invention.

In the driver circuit that is formed from a semiconductor integrated circuit with a multiple wiring layered structure and the method for manufacturing the same in accordance with the embodiment, the present invention is applied to inhibit or prevent a delay in a response to an input of a drive signal and to reduce noises on an output in the driver circuit. As shown in FIG. 7, the driver circuit has transistors $T_{r1}$–$T_{r4}$. A single drive signal is applied to each of the transistors $T_{r1}$–$T_{r4}$ to drive the transistors $T_{r1}$–$T_{r4}$ to thereby drive a load.

First, the driver circuit 10 in accordance with the present embodiment is described with reference to FIG. 7. FIG. 7 is a plan view of the driver circuit 10 as viewed in a direction in which the layers are stacked.

As shown in FIG. 7, the driver circuit 10 is formed from a semiconductor integrated circuit with a multiple wiring layered structure. For example, the driver circuit 10 has four transistors $T_{r1}$–$T_{r4}$. A single drive signal is applied to each of the transistors $T_{r1}$–$T_{r4}$ to drive the transistors $T_{r1}$–$T_{r4}$ to thereby drive a load. More particularly, the semiconductor integrated circuit forming the driver circuit 10 is formed from a semiconductor substrate, a dielectric layer formed over the semiconductor substrate and a wiring layer formed over the dielectric layer.

Gate electrodes $G_1$–$G_4$ are formed over the semiconductor substrate 11 as gate electrodes of the respective transistors $T_{r1}$–$T_{r4}$. The gate electrodes $G_1$–$G_4$ are preferably formed from polysilicon. The polysilicon has a sheet resistance of, for example, 100 $\Omega/\square$, and each gate width is, for example, about 80 $\mu$m.

A signal line $L_s$ composed of, for example, an aluminum alloy, is formed in the wiring layer for supplying the drive signal. The signal line $L_s$ is formed with a segment that perpendicularly traverses the gate electrodes $G_1$–$G_4$ such that the signal line $L_s$ passes end sections of the gate electrodes $G_1$–$G_4$. Also, signal lines $L_{s2}$–$L_{s4}$ are preferably formed in a manner to extend over and in parallel with the respective gate electrodes $G_1$–$G_4$. One ends of the signal lines $L_{s2}$–$L_{s4}$ connect to the signal line $L_s$. The aluminum alloy has a sheet resistance of, for example, 50 m$\Omega/\square$.

Next, a structure of the driver circuit 10 is described with reference to FIG. 8. FIG. 8 is an enlarged view of a region 100 defined by a broken line in FIG. 7. Certain reference numbers indicated below refer to elements that are the same as those shown in FIGS. 1–5.

The gate electrode $G_3$ is disposed over a gate dielectric layer 21 and a pad-like dielectric layer 17 formed over the semiconductor substrate 11. The contact hole $H_{32}$ is formed over the gate electrode $G_3$ in a region where the pad-like dielectric layer 17 is formed. Furthermore, end sections of the gate electrode $G_3$ are disposed over a dielectric layer 12 that forms an element isolation region 12, and contact holes $H_{31}$ and $H_{33}$ are formed in the respective end sections of the gate electrode $G_3$.

Similarly, the gate electrode $G_4$ is disposed over the gate dielectric layer 21 and pad-like dielectric layers 15 and 16 formed over the semiconductor substrate 11. Contact holes $H_{42}$ and $H_{43}$ are formed over the gate electrode $G_4$ in regions where the pad-like dielectric layers 15 and 16 are formed. Furthermore, end sections of the gate electrode $G_4$ are disposed over the dielectric layer 12 that forms the element isolation region 12, and contact holes $H_{41}$ and $H_{44}$ are formed in the respective end sections of the gate electrode $G_4$.

Impurity layers for source/drain regions 24, 25 and 26 are formed in the semiconductor substrate 11 on both sides of each of the gate electrodes $G_3$ and $G_4$. Silicide layers 33, 34 and 35, such as, for example, titanium silicide layers, are formed in part over the impurity layers for source/drain regions 24, 25 and 26. The silicide layers 33, 34 and 35 electrically connect to a wiring layer through contact holes 51, 52 and 53. The wiring layer is provided to supply a current to the impurity layers for source/drain region 24, 25 and 26.

The silicide layers 33, 34 and 35 are formed on parts of the impurity layers for source/drain region 24, 25 and 26. More specifically, the silicide layers 33, 34 and 35 are formed over the impurity layers 24, 25 and 26 at locations removed from the gate electrodes $G_3$ and $G_4$. As a result, a protection dielectric layer 31, such as, for example, a silicon oxide layer or a silicon nitride layer, is formed as a salicide protection over the impurity layers 24, 25 and 26 in areas other than the regions where the silicide layers 33, 34 and 35 are formed and over the gate electrodes $G_3$ and $G_4$.

Also, the pad-like dielectric layer 17 is formed below the gate electrode $G_3$. Similarly, the pad-like dielectric layers 15 and 16 are formed below the gate electrode $G_4$.

Portions of the gate electrode $G_3$ located above the pad-like dielectric layer 17 are preferably wider, in other words, larger in size as viewed from above, than portions of the gate electrode $G_3$ in regions where the pad-like dielectric layer 17 is not formed. Similarly, portions of the gate electrode $G_4$ located above the pad-like dielectric layers 15 and 16 are preferably wider, in other words, larger in size as viewed from above, than portions of the second gate electrode $G_4$ in regions where the pad-like dielectric layers 15 and 16 are not formed. By enlarging portions of the gate electrodes $G_3$ and $G_4$ in a manner described above, areas for forming the contact holes $H_{32}$, $H_{42}$ and $H_{43}$ over the gate electrodes $G_3$ and $G_4$ become larger, and the contact holes can be more readily formed.

The pad-like dielectric layers 15, 16 and 17 are formed below the respective gate electrodes $G_4$ and $G_3$ in the areas where the contact holes $H_{42}$, $H_{43}$ and $H_{32}$ are formed. Because the pad-like dielectric layers 15, 16 and 17 are present between the semiconductor substrate 11 and the contact holes $H_{42}$, $H_{43}$ and $H_{32}$, the gate dielectric layer 21 can avoid the influence of stresses that are generated during the formation of the contact holes $H_{42}$, $H_{43}$ and $H_{32}$, and thus the transistor characteristic is not deteriorated. Each of the pad-like dielectric layers 15, 16 and 17 may preferably have a greater width as viewed from above than a width of each of the gate electrodes $G_4$ and $G_3$ to preferably achieve its function described above.

The contact holes $H_{31}$–$H_{33}$ at the gate electrode $G_3$ and the contact holes $H_{41}$–$H_{44}$ at the gate electrode $G_4$ are formed at equal intervals, respectively. Because in this embodiment, the plural contact holes $H_{31}$–$H_{33}$ are $H_{41}$–$H_{44}$ are provided at equal intervals, a specified potential can be applied more evenly to the gate electrodes $G_3$ and $G_4$.

The pad-like dielectric layers 17, 16 and 15 are also preferably formed at equal intervals in order to dispose the contact holes $H_{31}$–$H_{33}$ and $H_{41}$–$H_{44}$ in the manner described above. More specifically, the pad-like dielectric layer 17 is spaced a distance W2 from one end of the gate electrode $G_3$. The pad-like dielectric layer 17 is spaced a distance W2 from the other end of the gate electrode $G_3$. Also, the pad-like dielectric layer 17 is preferably formed adjacent to the impurity layers for source/drain regions 25 and 26, and disposed between the silicide layers 34 and 35.

Similarly, the pad-like dielectric layers 15 and 16 are spaced a distance W3 from one another. The pad-like dielectric layer 15 is spaced a distance W3 from one end of the gate electrode $G_4$. The pad-like dielectric layer 16 is spaced a distance W3 from the other end of the gate electrode $G_4$. The pad-like dielectric layers 15 and 16 are formed adjacent to the impurity layers for source/drain regions 24 and 25, and disposed between the silicide layers 33 and 34.

The gate electrode $G_3$ electrically connects to the signal line $L_{s3}$ through the contact holes $H_{31}$–$H_{33}$. Similarly, the gate electrode $G_4$ electrically connects to the signal line $L_{s4}$ through the contact holes $H_{41}$–$H_{44}$. The signal lines $L_{s3}$ and $L_{s4}$ are provided to supply currents to the gate electrodes $G_3$ and $G_4$, and connected to the gate electrodes $G_3$ and $G_4$ through the plural contact holes $H_{31}$–$H_{33}$ and $H_{41}$–$H_{44}$ in order to shorten the current supply routes to the gate electrodes.

The transistors $T_3$ and $T_4$ in accordance with the present embodiment have, for example, an overall width W1 that is about 100 $\mu$m, and a segment width W3 divided by islands of the pad-like dielectric layers 15 and 16, which is, for example, about 27 $\mu$m.

Next, a method for manufacturing the driver circuit 10 is described.

The driver circuit 10 is manufactured in the following manner.

First, an element isolation region 12 and pad-like dielectric layers 15, 16 and 17 are formed on a surface of a semiconductor substrate 11 by a LOCOS method or a trench isolation method.

Then, a gate dielectric layer 21 may be formed over the semiconductor substrate 11 by a thermal oxidation method. Next, gate electrodes $G_3$ and $G_4$, preferably composed of doped polysilicon are formed over the gate dielectric layer 21. The processes described above correspond to a gate electrode forming step of certain embodiments of the present invention.

By conducting an ion implantation using the gate electrodes $G_3$ and $G_4$ as masks, an extension layer (not shown) such as an impurity layer with a low impurity concentration having an LDD structure may be formed over the semiconductor substrate 11. The extension layer is formed depending on the requirements that may be determined by the device structure. Then, sidewall spacers 27 are provided on both sides of each of the gate electrodes $G_3$ and $G_4$ by a known method. Further, an ion implantation is conducted using the gate electrodes $G_3$ and $G_4$ and the sidewall spacers 27 as masks and then an annealing is conducted to form impurity layers for source/drain regions 24, 25 and 26 in the semiconductor substrate 11.

Next, a dielectric layer as a protection insulation layer is deposited over the entire surface including the gate electrodes $G_3$ and $G_4$ and the impurity layers for source/drain regions 24, 25 and 26 by a CVD method. A silicon oxide layer, a silicon nitride layer or the like can be used as the protection insulation layer. Then, opening sections are formed in the insulation layer at specified regions by an ordinary photolithography process and an etching process with a reactive ion etching, with the result that a protection insulation layer 31 (that corresponds to the dielectric layer 14) is formed. The opening sections are formed in regions where silicide layers 33, 34 and 35 (to be described below) are to be formed. Then, a metal layer (not shown) for a silicide layer, such as, for example, a titanium layer, is deposited over the entire surface including the impurity layers for source/drain regions 24, 25 and 26 that are exposed through the opening sections. Then, a heat treatment is conducted to form silicide layers 33, 34 and 35 on exposed surfaces of the impurity layers 24, 25 and 26. Then, an interlayer dielectric layer 32 (that corresponds to the dielectric layer 14) is deposited over the entire surface including the silicide layers 33, 34 and 35. The process for forming the protection insulation layer 31 and the interlayer dielectric layer 32 described above correspond to a dielectric layer forming step of certain embodiments of the present invention.

Then, an ordinary photolithography process and an etching process with a reactive ion etching are conducted to form contact holes $H_{31}$–$H_{33}$ in the interlayer dielectric layer 32 and the protection insulation layer 31 over the gate electrode $G_3$, and also contact holes $H_{41}$–$H_{44}$ in the interlayer dielectric layer 32 and the protection insulation layer 31 over the gate electrode $G_4$.

The process described above corresponds to a contact hole forming step of certain embodiments of the present invention.

Then, a metal layer composed of, for example, an aluminum alloy is deposited on inside surfaces of the contact holes $H_{31}$–$H_{33}$ and $H_{41}$–$H_{44}$ and on the interlayer dielectric layer 32.

By the processes described above, the gate electrodes $G_3$ and $G_4$ are electrically connected to the signal lines $L_{s3}$ and $L_{s4}$ through the contact holes $H_{31}$–$H_{33}$ and $H_{41}$–$H_{44}$. A resist is coated over the top, and the resist is patterned using a mask having a specified wiring pattern. Then, the aluminum thin film is etched to form wiring layers. These processes correspond to a wiring layer forming step of an embodiment of the present invention.

It is noted that the side where the gate electrodes $G_1$ and $G_2$ are present can be simultaneously formed with the gate electrodes $G_3$ and $G_4$ using processes similar to those described above.

Next, an operation of the second embodiment is described.

When a drive signal is applied to the driver circuit 10 by a driver control circuit, the drive signal is inputted from the signal lines $L_s$, $L_{s2}$–$L_{s4}$ through the different number of contact holes to the respective gate electrodes $G_1$–$G_4$. For example, the drive signal is inputted in the gate electrode $G_1$ through one contact hole $H_{11}$, in the gate electrode $G_2$ through two contact holes $H_{21}$ and $H_{22}$, in the gate electrode $G_3$ through three contact holes $H_{31}$–$H_{33}$, and in the gate electrode $G_4$ through four contact holes $H_{41}$–$H_{44}$.

As a result, the times for the drive signal to reach the entire area of each of the gate electrodes $G_1$–$G_4$ are different. In other words, since the drive signal is inputted in the gate electrode $G_4$ through the four contact holes $H_{41}$–$H_{44}$, the amount of current that flows in the gate electrode $G_4$ is large, and therefore the time for the drive signal to reach the entire area of the gate electrode $G_4$ is fastest among the four gate electrodes $G_1$–$G_4$. On the other hand, the drive signal is inputted in the gate electrode $G_1$ through the single contact hole $H_{11}$, the amount of current that flows in the gate electrode $G_1$ is small, and therefore the time for the drive signal to reach the entire area of the gate electrode $G_1$ is slowest among the four gate electrodes $G_1$–$G_4$.

As a result, the transistors $T_{r1}$–$T_{r4}$ start switching at different timings from one another.

Next, this embodiment of the present invention is described with reference to FIG. 9. FIG. 9 shows a time chart of a drive signal and output signals. In FIG. 9, a solid line (number 2 in FIG. 9 legend) indicates an output signal that is provided from the driver circuit 10 in accordance with the embodiment of the present invention, a dashed line (number 3 in FIG. 9 legend) indicates an output signal that is provided from a conventional driver circuit, and a dash-and-dotted line (number 4 in FIG. 9 legend) indicates a drive signal that is supplied to both of the driver circuits.

When a drive signal having a high level for a time duration of about 40 ns (indicated by the dash-and-dotted line in FIG. 9) is applied to the conventional driver circuit, the driver circuit provides an output signal that rises with a delay being about 10 ns later than a rise of the drive signal and falls with a delay being about 19 ns later than a fall of the drive signal, as indicated by the dashed line in FIG. 9.

On the other hand, when the same drive signal (indicated by the dash-and-dotted line in FIG. 9) is applied to the driver circuit in accordance with the embodiment of the present invention, the driver circuit provides an output signal that rises with a delay being about 4 ns later than a rise of the drive signal and falls with a delay being about 5 ns later than a fall of the drive signal, as indicated by the solid line in FIG. 9. Also, it is recognized that current noises are reduced compared to the driver circuit 10 in the first embodiment.

Accordingly, it is understood that the driver circuit 10 in accordance with this embodiment of the present invention quickly responds to an input of the drive signal compared to the conventional driver circuit, and current noises may be reduced compared to the driver circuit 10 in accordance with the first embodiment.

In the manner described above, in accordance with the present embodiment, contact holes are provided in different numbers for the transistors $T_{r1}$–$T_{r4}$ for connecting the gate electrodes of the transistors $T_{r1}$–$T_{r4}$ to the signal lines $L_s$, $L_{s2}$–$L_{s4}$ that are separated from the transistors $T_{r1}$–$T_{r4}$ by the dielectric layer 14.

As a result, the time for an input signal to reach the entire area of the gate electrodes becomes shorter and a response to an input of a drive signal becomes relatively faster compared to the conventional driver circuit. Furthermore, the transistors $T_{r1}$–$T_{r4}$ start switching at different timings. Accordingly, compared to the driver circuit 10 in accordance with the first embodiment, additional effects are obtained. For example, the voltage on the power supply line that supplies a current to the transistors $T_{r1}-T_{r4}$ does not shift greatly, the current noise is reduced, and noises are difficult to be generated on the output. In particular, the present embodiment may favorably be applied to high power output transistors having a relatively large gate width, such as the transistors $T_{r1}-T_{r4}$, because such high power output transistors can benefit more from the effects of increasing the switching speed and differentiating the switching timings provided by this embodiment of the present invention.

In the second embodiment of the present invention described above, the connections sections include the contact holes $H_{11}$, $H_{21}-H_{22}$, $H_{31}-H_{33}$ and $H_{41}-H_{44}$ containing conductive material therein to form a contact between the gate electrodes $G_1-G_4$ and the signal lines $L_s$, $L_{s2}-L_{s4}$.

It is noted that three contact holes are provided for each of the transistors $T_{r1}-T_{r4}$ in accordance with the first embodiment, and different numbers of contact holes are provided for the transistors $T_{r1}-T_{r4}$ in accordance with the second embodiment. However, the present invention is not limited to the embodiments described above. The structures of the embodiments described above may be combined in appropriate manners to prevent a delay in a response to an input of a drive signal and reduce noises on an output. For example, three contact holes may be formed for the gate electrode $G_1$, four contact holes for the gate electrode $G_2$, five contact holes for the gate electrode $G_3$, and six contact holes for the gate electrode $G_4$.

Also, in a driver circuit and a method for manufacturing the same in accordance with the first embodiment of the present invention, the driver circuit 10 has four transistors $T_{r1}-T_{r4}$. However, the present invention is not limited to this embodiment. Certain embodiments of the present invention are applicable to a driver circuit 10 that has any number of transistors more or less than four transistors as long as the driver circuit 10 has at least one transistor.

Also, in the first embodiment, three contact holes are provided for each of the gate electrodes $G_1-G_4$. However, the present invention is not limited to this embodiment. Contact holes in a smaller number or a greater number can be provided for each of the gate electrodes $G_1-G_4$ as long as a plurality of contact holes are provided for each of the gate electrodes $G_1-G_4$. In the later case, the time for an input signal to reach the entire area of the gate electrodes becomes shorter and a response to an input of a drive signal becomes quicker.

Also, in a driver circuit and a method for manufacturing the same in accordance with the second embodiment of the present invention, the driver circuit 10 has four transistors $T_{r1}-T_{r4}$. However, the present invention is not limited to this embodiment. Certain embodiments of the present invention are applicable to a driver circuit 10 that has any number of transistors more or less than four transistors as long as the driver circuit 10 has a plurality of transistors.

Also, in accordance with the first embodiment and the second embodiment of the present invention, the driver circuit 10 is formed over a semiconductor substrate 11. However, the present invention is not limited to this embodiment. For example, a semiconductor region may be formed over an SIO substrate or a glass substrate, and a driver circuit 10 may be formed over the semiconductor region. In other words, a substrate for forming the driver circuit 10 is not limited to a semiconductor substrate 11, but can be provided by a substrate including a semiconductor region or semiconductor layer.

Also, in the driver circuit and the method for manufacturing the same in accordance with the first embodiment of the present invention, as shown in FIG. 1, the driver circuit is formed from a semiconductor integrated circuit with a multiple wiring layered structure and has transistors $T_{r1}-T_{r4}$, in which a single drive signal is applied to each of the transistors $T_{r1}-T_{r4}$ to drive the transistors $T_{r1}-T_{r4}$ to thereby drive a load. This embodiment of the present invention is applied to inhibit or prevent a delay in a response to an input of a drive signal in the driver circuit. However, certain embodiments of the present invention are also applicable to other cases without departing the subject matter of the present invention.

Also, in a driver circuit and a method for manufacturing the same in accordance with the second embodiment of the present invention, as shown in FIG. 7, the driver circuit is formed from a semiconductor integrated circuit with a multiple wiring layered structure and has transistors $T_{r1}-T_{r4}$, in which a single drive signal may be applied to each of the transistors $T_{r1}-T_{r4}$ to drive the transistors $T_{r1}-T_{r4}$ to thereby drive a load. This embodiment of the present invention is applied to inhibit or prevent a delay in a response to an input of a drive signal in the driver circuit and to reduce noises on an output. However, embodiments of the present invention are also applicable to other cases without departing the subject matter of the present invention.

As described above, various effects are obtained by the driver circuits described above. For example, the time for an input signal to reach the entire area of the gate electrodes is shortened, and a response to an input of the drive signal becomes relatively faster, compared to the conventional structure. In particular, in case of a high power output transistor that has a relatively large gate width, greater effects are obtained in increasing the switching speed. Accordingly, the application of certain embodiments of the present invention are more preferable in the case of a high power output transistor.

Furthermore, by the driver circuits according to certain embodiments, at least two of the plural transistors start switching operations at different timings. As a result, the voltage on the power supply line that supplies a current to the transistors does not shift greatly, the current noise is reduced, and noises are difficult to be generated on the output, compared to the driver circuits of other embodiments. In particular, certain embodiments of the present invention can favorably be applied to high power output transistors having a relatively large gate width, because such high power output transistors can benefit more from the effects of increasing the switching speed and differentiating the switching timings provided by certain embodiments of the present invention.

Furthermore, by the driver circuits according to certain embodiments, at least two of the plural transistors start switching operations at different timings. As a result, the voltage on the power supply line that supplies a current to the transistors does not shift greatly, the current noise is reduced, and noises are difficult to be generated on the output. In particular, certain embodiments of the present invention can favorably be applied to high power output transistors having a relatively large gate width, because such high power output transistors can benefit more from the effects of increasing the switching speed and differentiating the switching timings provided by embodiments of the present invention.

Various effects are obtained by the method for manufacturing a driver circuit according to certain embodiments of the present invention. For example, the time for an input signal to reach the entire area of the gate electrodes is shortened, and a response to an input of the drive signal becomes relatively faster, compared to the conventional structure. In particular, certain embodiments of the present invention are favorably applied in the case of a high power output transistor that has a relatively large gate width, because greater effects are obtained in increasing the switching speed.

What is claimed:

1. A driver circuit comprising a semiconductor integrated circuit having a transistor in which a drive signal is applied to the transistor to drive the transistor to thereby drive a load, the driver circuit comprising:

an element region at least partially surrounded by an element isolation region;

a signal line that supplies the drive signal to the transistor, the signal line extending across the element region;

a gate dielectric layer formed in the element region;

a gate electrode layer, wherein part of the gate electrode layer is positioned on the gate dielectric layer in the element region and part of the gate electrode layer is positioned outside of the element region;

at least two connection sections that connect the signal line to the gate electrode layer, wherein at least one connection section is positioned outside of the element region and at least one connection section is positioned in the element region; and wherein at least one connection section positioned in the element region includes a contact surface in direct contact with the gate electrode of the transistor, the transistor having a source region and a drain region, the contact surface including a center that is closer to the source region of the transistor than to the drain region of the transistor.

2. A driver circuit comprising a semiconductor integrated circuit having a plurality of transistors in which a single drive signal is applied to each of the transistors to drive the transistors to thereby drive a load, the driver circuit comprising:

an element region at least partially surrounded by an element isolation region;

a signal line for each of the transistors that supplies the drive signal and extends across the element region;

a gate dielectric layer on a semiconductor substrate in the element region for each of the transistors;

a gate electrode layer on the gate dielectric layer in the element region for each of the transistors, wherein part of the gate electrode layer extends to outside of the element region; and at least two connection sections that connect the signal line to the gate electrode for at least one of the transistors, wherein a first connection section of the at least two connection sections is positioned outside of the element region and a second connection section of the at least two connections sections is positioned in the element region;

a source region and a drain region in the semiconductor substrate in the element region;

wherein the gate electrode layer is positioned over a portion of the semiconductor substrate that is located between the source region and the drain region;

wherein the gate electrode layer includes an upper surface including first and second upper surface areas that are positioned over the portion of the semiconductor substrate that is positioned between the source region and the drain region; and wherein the first upper surface area is in direct contact with the second connection section, the second upper surface area is not in direct contact with the second connection section, and the second upper surface area is positioned closer to the drain region than to the source region.

3. A driver circuit according to claim 2, wherein the at least two connection sections includes two or more connection sections provided for each of the transistors.

4. A driver circuit according to claim 2, wherein the at least two connection sections includes two or more connection sections provided for each of the transistors except one of the transistors.

5. A driver circuit according to claim 2, wherein at least two of the plurality of transistors have a different number of connection sections.

6. A driver circuit according to claim 3, wherein at least two of the plurality of transistors have a different number of connection sections.

7. A driver circuit according to claim 4, wherein at least two of the plurality of transistors have a different number of connection sections.

8. A driver circuit according to claim 2, wherein the plurality of transistors have different numbers of connection sections.

9. A driver circuit comprising a semiconductor integrated circuit having a plurality of transistors in which a single drive signal is applied to each of the transistors to drive the transistors to thereby drive a load, the driver circuit comprising:

a signal line that supplies the drive signal, the signal line being separated from each of the transistors by a dielectric layer; and connection sections for connecting the signal line to a gate electrode of each of the transistors, the connection sections being provided in a width direction of the gate electrode, wherein at least two of the plurality of transistors have a different number of connection sections;

wherein at least one connection section includes a contact surface in direct contact with the gate electrode of one of the transistors, the transistor having a source region and a drain region, the contact surface including a center that is closer to a source region of the transistor than to a drain region of the transistor.

10. A driver circuit according to claim 9, wherein the plurality of transistors have different numbers of connection sections.

11. A driver circuit comprising a semiconductor integrated circuit having at least a first transistor in which a drive signal is applied to the first transistor, the driver circuit comprising:

an isolation region extending around an active region of a semiconductor substrate;

a gate dielectric layer on the active region;

a first gate electrode layer of the first transistor formed on the gate dielectric layer on the active region;

a first signal line that supplies the drive signal to the first transistor;

a first connection extending from the first signal line to the first gate electrode layer on the dielectric layer on the active region;

the first gate electrode layer also extending on the isolation region; and a second connection extending from the signal line to the first gate electrode layer on the isolation region, wherein at least the first connection extending from the first signal line to the first gate electrode layer includes a contact surface in direct contact with the first gate electrode of the first transistor, the first transistor including a source region and a drain region, the contact surface including a center that is closer to the source region of the first transistor than to the drain region of the first transistor.

12. A driver circuit according to claim 11, wherein an additional dielectric layer is positioned between the signal line and the first gate electrode layer, and the at least two connections extend through the additional dielectric layer.

13. A driver circuit according to claim 12, wherein the first transistor includes source and drain regions positioned in the active region, and wherein a protective insulation layer is formed in direct contact with the first gate electrode and the source and drain regions.

14. A driver circuit according to claim 13, further comprising a silicide layer formed in direct contact with the source and drain regions.

15. A driver circuit according to claim 11 including a plurality of additional transistors, the driver circuit further comprising:

a gate electrode layer on a dielectric layer on the active region for each of the additional transistors;

a signal line for each of the additional transistors; and at least one connection extending from the signal line for each of the additional transistors to the gate electrode layer on the dielectric layer on the active region for each of the additional transistors.

16. A driver circuit according to claim 15, wherein the gate electrode layer for each of the additional transistors also extends on the isolation region; and wherein at least one connection extends from the signal line for each of the additional transistors to the gate electrode layer on the isolation region.

17. A driver circuit according to claim 16, wherein at least two of the transistors have a different number of connections extending from the signal line to the gate electrode layer.

18. A driver circuit comprising a semiconductor integrated circuit having at least a first transistor in which a drive signal is applied to the first transistor, the driver circuit comprising:

an isolation region extending around an active region of the semiconductor substrate, the first transistor including source and drain regions formed in the active region;

a dielectric layer formed on the substrate;

a first gate electrode layer of the first transistor formed on the dielectric layer on the semiconductor substrate and extending across the active region;

a first signal line that supplies the drive signal, the first signal line extending across the active region; and at least two connections extending from the first signal line to the first gate electrode layer, wherein at least one of the connections is positioned directly over the active region;

wherein at least one connection that is positioned over the active region includes a lower surface having a center that is closer to the source region than to the drain region.

19. A driver circuit as in claim 18, further comprising additional transistors, the driver circuit further comprising:

a gate electrode layer on a dielectric layer on the active region for each of the additional transistors;

a signal line for each of the additional transistors; and at least one connection section extending from the signal line for each of the additional transistors to the gate electrode layer on the dielectric layer on the active region for each of the additional transistors.

20. A driver circuit according to claim 19, wherein at least two of the transistors have a different number of connections extending from the signal line to the gate electrode layer.

21. A driver circuit comprising a semiconductor integrated circuit having a transistor in which a drive signal is applied to the transistor to drive the transistor to thereby drive a load, the driver circuit comprising:

a element region at least partially surrounded by an element isolation region;

a signal line that supplies the drive signal to the transistor, the signal line extending across the element region;

a gate dielectric layer formed in the element region;

a gate electrode layer, wherein part of the gate electrode layer is positioned on the dielectric layer in the element region and part of the gate electrode layer is positioned outside of the element region;

at least two connection sections that connect the signal line to the gate electrode layer, wherein at least one connection section is positioned outside of the element region and at least one connection section is positioned in the element region; and wherein the transistor includes a source region and a drain region, and the signal line includes a signal line portion positioned over part of the source region.

22. A driver circuit as in claim 21, further comprising an interlayer dielectric layer positioned between the signal line portion and the part of the source region.

23. A driver circuit comprising a semiconductor integrated circuit having a transistor in which a drive signal is applied to the transistor to drive the transistor to thereby drive a load, the driver circuit comprising:

an element region at least partially surrounded by an element isolation region;

a signal line that supplies the drive signal to the transistor, the signal line extending across the element region;

a first dielectric layer comprising a gate dielectric layer formed in the element region;

a gate electrode layer, wherein part of the gate electrode layer is positioned on the gate dielectric layer in the element region and part of the gate electrode layer is positioned outside of the element region;

at least two connection sections that connect the signal line to the gate electrode layer, wherein at least one connection section is positioned outside of the element region and at least one connection section is positioned in the element region;

the transistor including a source region and a drain region in the element region; and a second dielectric layer, wherein the signal line including a signal line portion that is separated from the source region by the second dielectric layer,

* * * * *